(12) United States Patent
Yano

(10) Patent No.: US 9,779,830 B2
(45) Date of Patent: Oct. 3, 2017

(54) NON-VOLATILE SEMICONDUCTOR MEMORY DEVICE AND ERASE METHOD THEREOF

(71) Applicant: Winbond Electronics Corp., Taichung (TW)

(72) Inventor: Masaru Yano, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/233,231

(22) Filed: Aug. 10, 2016

(65) Prior Publication Data

US 2017/0047123 A1 Feb. 16, 2017

(30) Foreign Application Priority Data

Aug. 12, 2015 (JP) ................................ 2015-159462

(51) Int. Cl.
*G11C 16/34* (2006.01)
*G11C 16/04* (2006.01)
*G11C 16/14* (2006.01)

(52) U.S. Cl.
CPC ...... *G11C 16/3445* (2013.01); *G11C 16/0483* (2013.01); *G11C 16/14* (2013.01); *G11C 16/3472* (2013.01)

(58) Field of Classification Search
CPC . G11C 16/3445; G11C 16/0483; G11C 16/14; G11C 16/3472
USPC ............................ 365/185.3, 17, 29; 711/103
See application file for complete search history.

(56) References Cited

U.S. PATENT DOCUMENTS

| | | | | |
|---|---|---|---|---|
| 6,493,266 B1 * | 12/2002 | Yachareni | .......... | G11C 16/3436 365/185.22 |
| 6,714,457 B1 * | 3/2004 | Hsu | ..................... | G11C 11/5628 365/185.03 |
| 7,400,537 B2 * | 7/2008 | Hemink | .............. | G11C 11/5628 365/185.18 |
| 7,495,954 B2 * | 2/2009 | Ito | ..................... | G11C 16/3468 365/185.02 |
| 7,710,787 B2 * | 5/2010 | Whiston | ............ | G11C 16/3468 365/185.1 |
| 7,907,449 B2 * | 3/2011 | Lee | ........................ | G11C 16/16 365/185.11 |

(Continued)

FOREIGN PATENT DOCUMENTS

JP  2007-102923 A  4/2007
JP  2012-027979 A  2/2012

*Primary Examiner* — Vu Le
*Assistant Examiner* — Sung Cho
(74) *Attorney, Agent, or Firm* — Muncy, Geissler, Olds & Lowe, P.C.

(57) ABSTRACT

Provided is an erase method for a non-volatile semiconductor memory device to compensate for the change in property of a memory cell, in proportion to the number of data rewrites to the memory cell. The erase method has an erase step to erase charges of a charge accumulation layer by applying an erase voltage to a channel region of a selected memory cell, and a soft-programming step to perform soft-programming to the charges in the accumulation layer by virtue of applying a soft-programming voltage which is smaller than a programming voltage to program the memory cell. The erase voltage is increased step by step when it is applied repeatedly. The soft-programming voltage is decreased step by step when it is applied repeatedly.

8 Claims, 11 Drawing Sheets

(56) References Cited

U.S. PATENT DOCUMENTS

| | | | | |
|---|---|---|---|---|
| 7,944,746 B2* | 5/2011 | Jones | ............... | G11C 16/14 |
| | | | | 365/185.02 |
| 8,081,519 B2* | 12/2011 | Lee | ............... | G11C 11/5635 |
| | | | | 365/185.18 |
| 8,194,457 B2* | 6/2012 | Chang | ............... | G11C 16/10 |
| | | | | 365/185.18 |
| 8,797,802 B2* | 8/2014 | Hung | ............... | G11C 16/14 |
| | | | | 365/185.19 |
| 8,942,047 B2* | 1/2015 | Mui | ............... | G11C 11/5642 |
| | | | | 365/185.21 |
| 2003/0161187 A1* | 8/2003 | Lin | ............... | G11C 16/3468 |
| | | | | 365/185.29 |
| 2006/0023500 A1* | 2/2006 | Kawabata | ........... | G11C 7/1051 |
| | | | | 365/185.01 |
| 2006/0044919 A1* | 3/2006 | Taoka | ............... | G11C 16/107 |
| | | | | 365/230.03 |
| 2007/0030730 A1* | 2/2007 | Bovino | ............ | G11C 11/5628 |
| | | | | 365/185.2 |
| 2008/0144391 A1* | 6/2008 | Yang | ............... | G11C 16/3404 |
| | | | | 365/185.24 |
| 2010/0165735 A1* | 7/2010 | Hashimoto | ........... | G11C 16/30 |
| | | | | 365/185.18 |
| 2012/0201082 A1* | 8/2012 | Choy | ............... | G11C 16/16 |
| | | | | 365/185.19 |
| 2014/0108705 A1* | 4/2014 | Gorobets | ........... | G11C 16/3431 |
| | | | | 711/103 |
| 2015/0169463 A1* | 6/2015 | Zitlaw | ............... | G11C 16/10 |
| | | | | 711/103 |

* cited by examiner

| | Erase | Write | Read-Out |
|---|---|---|---|
| Selected W/L | 0 | 15~20V | 0 |
| Non-selected W/L | F | 10V | 4.5 |
| SGD | F | Vcc | 4.5 |
| SGS | F | 0 | 4.5 |
| SL | F | Vcc | 0 |
| P Well | 18~ | 0 | 0 |

(When number of P/E cycle is small)

(When number of P/E cycle is large)

NON-VOLATILE SEMICONDUCTOR MEMORY DEVICE AND ERASE METHOD THEREOF

CROSS REFERENCE TO RELATED APPLICATION

This application claims the benefit of Japan Application No. JP 2015-159462, filed on Aug. 12, 2015, the entirety of which is incorporated by reference herein.

BACKGROUND OF THE INVENTION

Field of the Invention

The present invention relates to the reliability of NAND-type flash memory, NOR-type flash memory, etc., and in particular it relates to an erase method of the flash memory for reducing the decreases in reliability that result from repeated writing and erasing operations.

Description of the Related Art

FIG. 1 schematically shows, in a cross section, a memory cell array of a flash memory. An N-well 12 is formed in a P-type substrate (P-sub) 10, and a P-well 14 is formed in the N-well 12. A plurality of transistors constituting NAND strings are formed in the P-well 14. Each of the NAND strings comprises a plurality of memory cells connected in series, a source-line selection transistor connected to a terminal of the memory cell, and a bit-line selection transistor connected to the other terminal of the memory cell. FIG. 1 shows a plurality of memory cell 20 connected in series, a source-line side selection transistor 22 and a bit-line side selection transistor 24. In FIG. 1, a plurality of NAND strings are formed in a row and all NAND strings in the P-well 14 constitute a block.

A source line SL is electrically connected to an n-diffusion region (source region) 23 of the source-line selection transistor 22, and a bit line BL is electrically connected to an n-diffusion region (drain region) 23 of the bit-line selection transistor 24. Moreover, a p$^+$-diffusion region 26 for contact is formed in the P-well 14, an n$^+$-diffusion region 27 is formed the N-well 12, and the two diffusion regions 26 and 27 are connected by virtue of a common contact 28. As described herein, erase pulses of high voltage are applied to the P-well by the common contact 28 when erasing a selected block.

FIG. 2 shows an equivalent circuit of a flash memory cell array. As shown in FIG. 2, a plurality of word lines WL1, WL2, . . . WLn are formed in the direction of the rows crossing the NAND strings. Each of the word lines WL connects the control gates of the corresponding memory cells 20 which are arranged in the row direction. Each of the selection gate-lines SGS connects the gates of the source-line selection transistors 22 which are arranged in the row direction, and each of the selection gate-lines SGD connects the gates of the bit-line selection transistors 24 which are arranged in the row direction. NAND strings are electrically connected to source lines SL when the source-line selection transistors 22 are turned on by selection gate-lines SGS. NAND strings are electrically connected to bit lines BL when the bit-line selection transistors 24 are turned on by virtue of the selection gate-lines SGD.

FIG. 3 shows voltage waveforms of nodes in an erase selection block when NAND flash memory carries out an erase operation. The Node N1 is the common contact 28 of the N-well/P-well, the node N2 is the diffusion region 23 of the source line SL for contact, the node N3 is the gate of the source-line side selection transistor 22, the node N4 is the word line (control gate) of the memory cells 20 in the same block, the node N5 is the gate of the bit-line side selection transistor 24 and the node N6 is the diffusion region of the bit-line BL for contact. Moreover, the waveform at the node N4 in a non-selected block becomes the same as those at nodes N3~N5 in the selected block.

In NAND-type flash memory, data erasing is carried out in units of block. At this time, the voltage at the bit line of the selected block is set to zero volts (0V) or less than the voltage at the P-well 14 and a positive erase pulse is applied to the P-well 14 in which the memory cell array is formed. After applying the erase pulse Ps, the voltage of the P-well 14 returns to 0V. At this time, the voltages at nodes N2, N3, N5 and N6 are automatically boosted by virtue of capacitive coupling with the P-well 14. After erasing, it is determined whether the threshold values of the memory cells in the selected block are less than a certain value by a verification read-out. If the threshold values of all the memory cells in the block are less than the certain value, then the erase operation is completed; otherwise, if the threshold values of some of the memory cells are higher than the certain value, then the erase pulse Ps is applied again and the verification read-out is carried out (as disclosed in patent document 1).

Furthermore, to control the lower limit of the threshold value distribution of the erased memory cells, soft-programming and soft-programming verification are proposed to carry out to the erased memory cells (as disclosed in patent document 2). The flow chart is shown in FIG. 4. In FIG. 4, erase pulses Ps are applied in step S10 to erase data in the selected memory cells. Then, erase verification is carried out in step S20 to verify if the upper limit of the threshold values of the erased memory cells is below the certain value. When the erase verification is qualified, soft-programming verification is carried out in step S40 to verify if the lower limit of the threshold values of the erased memory cells is above the certain value. In step S30, soft-programming is carried out on the memory cells which are not qualified in the soft-programming verification. By using the process described above, the lower limit of the threshold value distribution is kept higher than the certain value.

On the other hand, the voltage of the P-well 14 is set to 0V and high voltages are applied to the selected word lines when a writing (programming) operation is performed. 0V and positive voltage may be applied to the bit line. When 0V is applied, the voltages at the silicon surface of the selected memory cells become 0V and electron tunneling current flows from the silicon substrate to the floating gate, whereby the threshold values of the memory cells become higher than the certain value.

PATENT DOCUMENTS

Document 1: Japan laid-open patent application 2012-027979

Document 2: Japan laid-open patent application 2007102923

BRIEF SUMMARY OF THE INVENTION

Problem to be Solved by the Invention

In conventional NAND-type flash memory, etc., the oxide film under the floating gate will deteriorate after repeated writing/erasing (data rewriting). The hole/electron traps result in deterioration of conductance and thus poor data preservation. To solve these problems, as described in patent document 2, soft-programming can be carried out on the over-erased memory cells in an erase operation to narrow the threshold value distribution of the memory cells, thereby inhibiting deterioration of reliability due to data rewriting.

However, soft-programming may introduce secondary adverse effects. FIG. 5 is an experimental result showing the relationship between the number of data rewrites and the threshold values of the memory cells. The horizontal axis represents the number of write (program)/erase cycles; the vertical axis represents threshold values (Vth) of the memory cell. In some experiments, the threshold value of a memory cell is 2V when the memory cell is initially programmed, and the threshold value of the memory cell is −4V when the memory cell is initially erased. After the initial write/erase operation, repeated writing/erasing is performed under the same conditions.

As a result, the threshold value (line MP) of the programmed memory cell increases as the number of cycles increases. When the number of cycles reaches 100000, the threshold value changes from 2V to about 5V. Such a change can increase as the number of cycles increases, and the injection of the electrons from the channel region to the floating gate (charge accumulation layer) becomes easy. That is, the memory cells can easily become over-programmed and thus the programming speed becomes fast. On the other hand, the threshold value (line ME) of the erased memory cell also increases as the number of cycles increases. When the number of cycles reaches 100000, the threshold value changes from −4V to about 1.5V. Such a change increases as the number of cycles increases, and the tunneling of the electrons from the floating gate to the channel region becomes easy. That is, data erasing to the memory cells become difficult and thus the erasing speed becomes slow.

In this way, when the number of data rewrites increases, if all soft-programming is carried out in the same condition after data erasing, the memory cells will easily become over-programmed due to the characteristics of the memory cells. As a result, the threshold value deviates toward the positive value, resulting in adverse effects on the threshold value distribution.

The object of the invention is to solve the conventional problem described above and to provide an erase method for a non-volatile semiconductor memory device to compensate for the change in property of a memory cell in proportion to the number of rewrites of data to the memory cell.

Technical Means to Solve the Problem

The invention proposes an erase method of non-volatile semiconductor memory device. The non-volatile semiconductor memory device has a memory array of memory cells each of which has a control gate, a charge accumulation layer and a channel region. The erase method comprises a selection step, selecting at least a memory cell to be erased from the memory array; an erase step, erasing charges in the accumulation layer by applying an erase voltage to the channel region of the selected memory cell; and a soft-programming step, after applying the erase voltage, applying a soft-programming voltage, which is smaller than a programming voltage for programming the memory cell, to the control gate of the selected memory cell, thereby softly programming the charges in the charge accumulation layer. In the erase step, the erase voltage is increased step by step when the erase voltage is applied repeatedly. In the soft-programming step, the soft-programming voltage is decreased step by step when the soft-programming voltage is applied repeatedly.

It is desirable that the soft-programming is carried out right after the erase step and no erase verification is carried out between the erase step and the soft-programming step. It is desirable that the number of times that the erase voltage is applied is equal to the number of times that the soft-programming voltage is applied. It is desirable that the erase method further comprises an erase verification step, determining if data erasure of the memory cell is qualified; wherein the erase verification is carried out after the soft-programming step, and when the erase verification step determines that the erasure of the memory cell is not qualified, the erase step and the soft-programming step are carried out. It is desirable that the erase method further comprises a soft-programming verification step, carried out after the erase verification step to determine whether soft-programming of the memory cell is qualified; and when the soft-programming verification step determines that the soft-programming of the memory cell is not qualified, the soft-programming step is carried out on the memory cell which is not qualified.

The invention proposes a non-volatile semiconductor memory device comprising a memory array having a plurality of memory cells, each of which has a control gate, a charge accumulation layer and a channel region; a selection device, selecting at least a memory cell to be erased from the memory array; and an erase device, erasing data in the selected memory cell selected by virtue of the selection device. The erase device erases charges in the accumulation layer by virtue of applying an erase voltage to the channel region of the selected memory cell. After applying the erase voltage, the erase device applies a soft-programming voltage, which is smaller than a programming voltage for programming the memory cell, to the control gate of the selected memory cell, thereby soft-programming the charges in the charge accumulation layer. The erase device further increases the erase voltage step by step when the erase voltage is repeatedly applied and decreases the soft-programming voltage step by step when the soft-programming voltage is applied repeatedly.

It is desirable that after data erasing, the erase device carries out a soft-programming rather than erase verification. It is desirable that the erase device further carries out an erase verification to determine whether data erasing of the memory cell is qualified after the soft-program; and when the determination is not qualified by the erase verification, the erase device carries out the data erasing of the memory cell. It is desirable that the erase device further carries out a soft-programming verification to determine whether soft-programming of the memory cell is qualified after the erase verification; and when the determination is not qualified by the soft-programming verification, the erase device carries out the soft-programming to the memory cell that is not qualified. It is desirable that the memory array comprises NAND-type strings; the selection device selects a block to be erased and the erase device erases the memory cells of the selected block.

Effect of the Invention

According to the invention, because the soft-programming is carried out after data erasing, the erase operation can be carried out on the memory cells which have been compensated for the change in property due to the increasing number of data rewrites and the decrease in reliability due to the increasing number of data rewrites can be inhibited. In addition, compared with cases where the erase verification is carried out after the data erasing, carrying out soft-programming right after the data erasing can inhibit the charge traps in the isolation layer resulting from data erasing and thus inhibit the deterioration of the isolation layer. As a result, the number of times that data is written can be increased, simultaneously maintaining the reliability of the memory cells.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Herein, the exemplary embodiments of the invention will be described in detail in reference to the accompanying drawings. Moreover, drawings are shown by emphasizing respective portions for easy understanding, and it should be noted that the dimensions thereof are not identical to those of practical devices.

Figure 6:
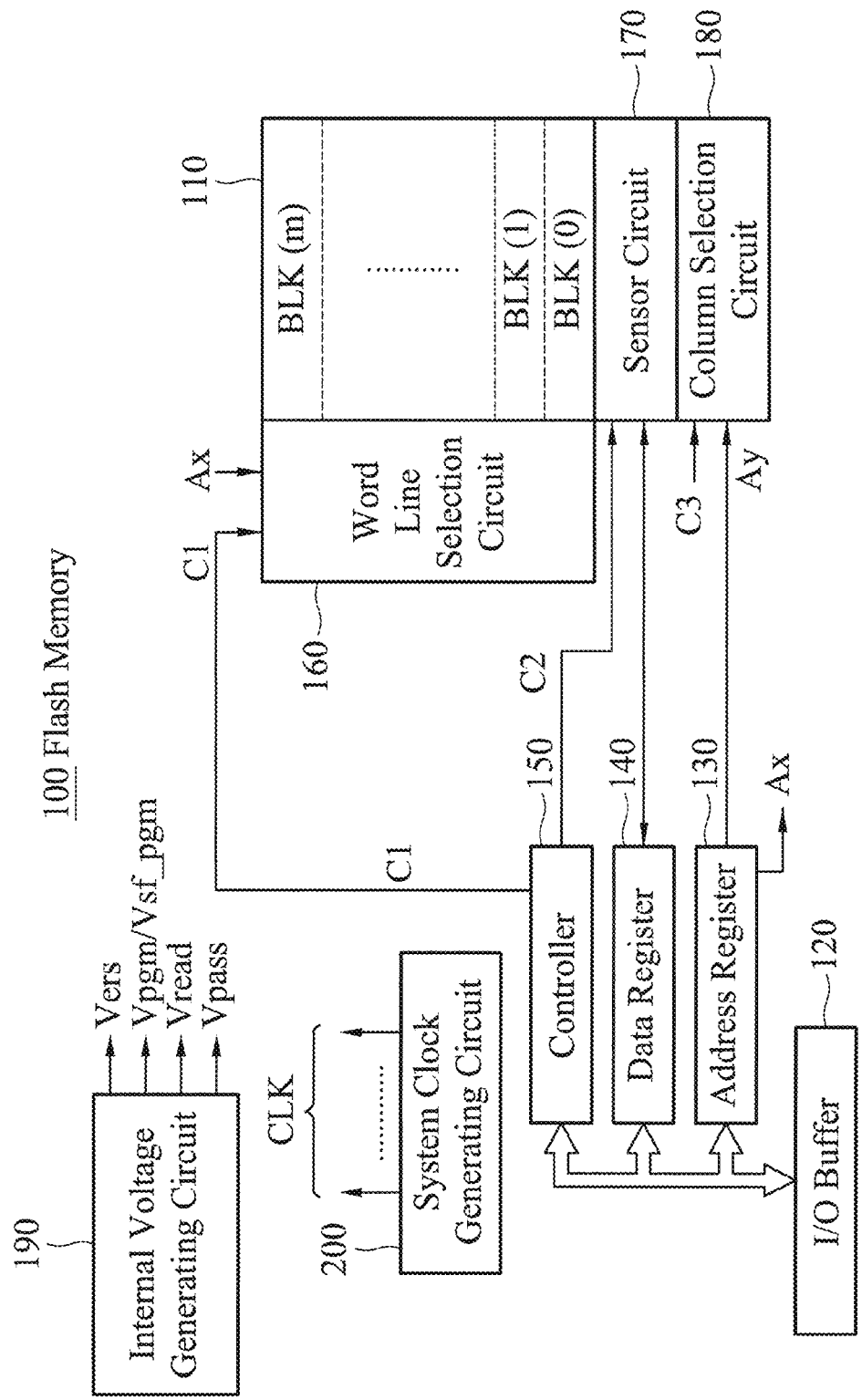
FIG. 6 is an exemplary block diagram showing a whole structure of a NAND-type flash memory according to an exemplary embodiment of the disclosure.

FIG. 6 is a block diagram showing an exemplary structure of a NAND-type flash memory according to an embodiment of the invention. As shown in FIG. 6, the flash memory 100 comprises a memory array 110, an input/output buffer 120, an address register 130, a data register 140, a controller 150, a word-line selection circuit 160, a page buffer/sensor circuit 170, a row selection circuit 180, an internal voltage generating circuit 190, and a system clock generating circuit 200. The memory array 110 has a plurality of memory cells arranged in rows and columns. The input/output buffer 120 connects an external input/output terminal I/O and buffers output data. The address register 130 receives address data from the input/output buffer 120. The data register 140 keeps data that has been input/output. The controller 150 generates control signals C1, C2 and C3, etc. based on command data and external control signals (such as chip enable signal and address latch enable signal, not shown in FIG. 6) from the input/output buffer 120 for controlling each portion of the flash memory 100. The word-line selection circuit 160 decodes row address information Ax from the address register 130 and selects blocks and word lines based on the decoding result. The page buffer/sensor circuit 170 keeps the data which have been read out by virtue of bit lines and keeps programming data by virtue of bit lines. The column selection circuit 180 decodes column address information Ay from the address register 130 and selects bit lines based on the decoding result. The internal voltage generating circuit 190 generates required voltages (programming voltage Vpgm, pass voltage Vpass and read-out voltage Vread, erase voltage Vers, soft-programming voltage Vsf_pgm) for reading, programming (writing) and erasing data. The system clock generating circuit 200 generates internal system clock CLK. However, the structure shown here is merely an example.

Figure 1:
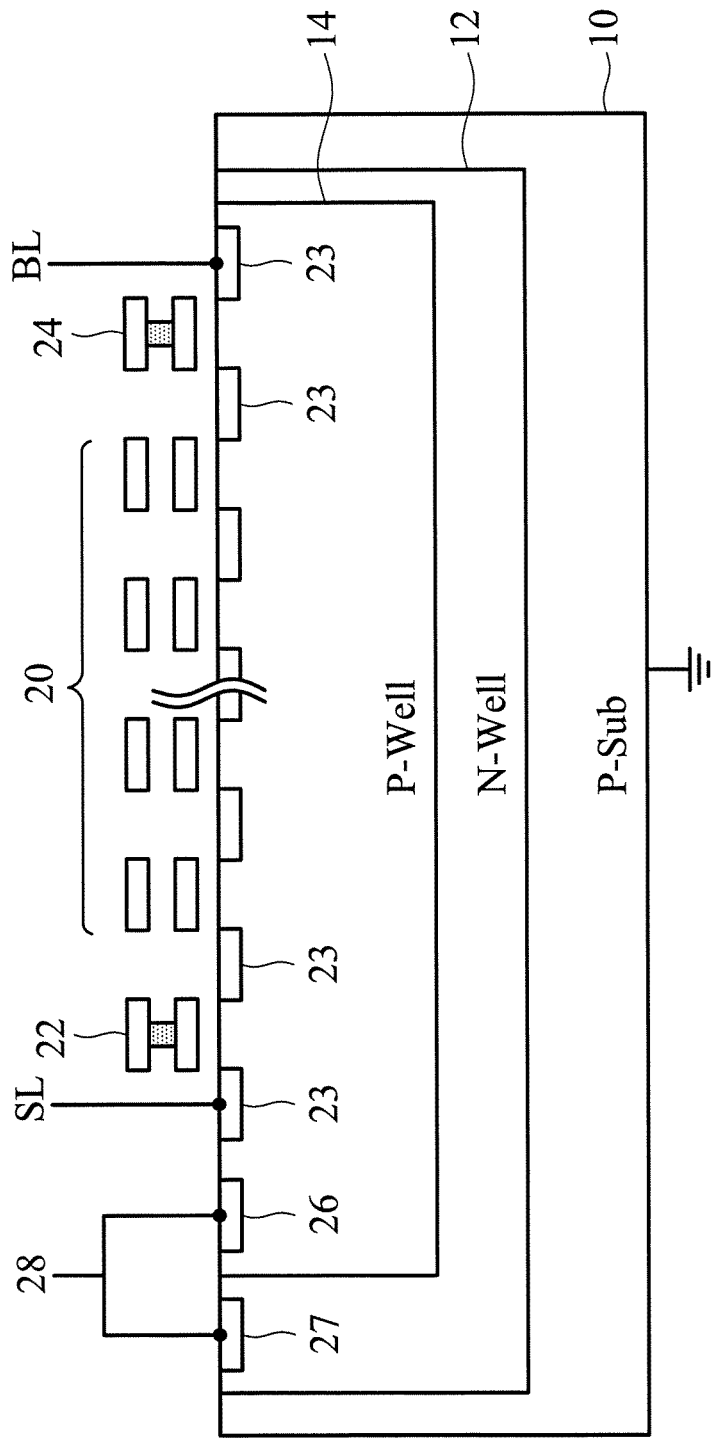
FIG. 1 schematically shows, in a cross section, a memory cell array of a NAND-type flash memory.
Figure 2:
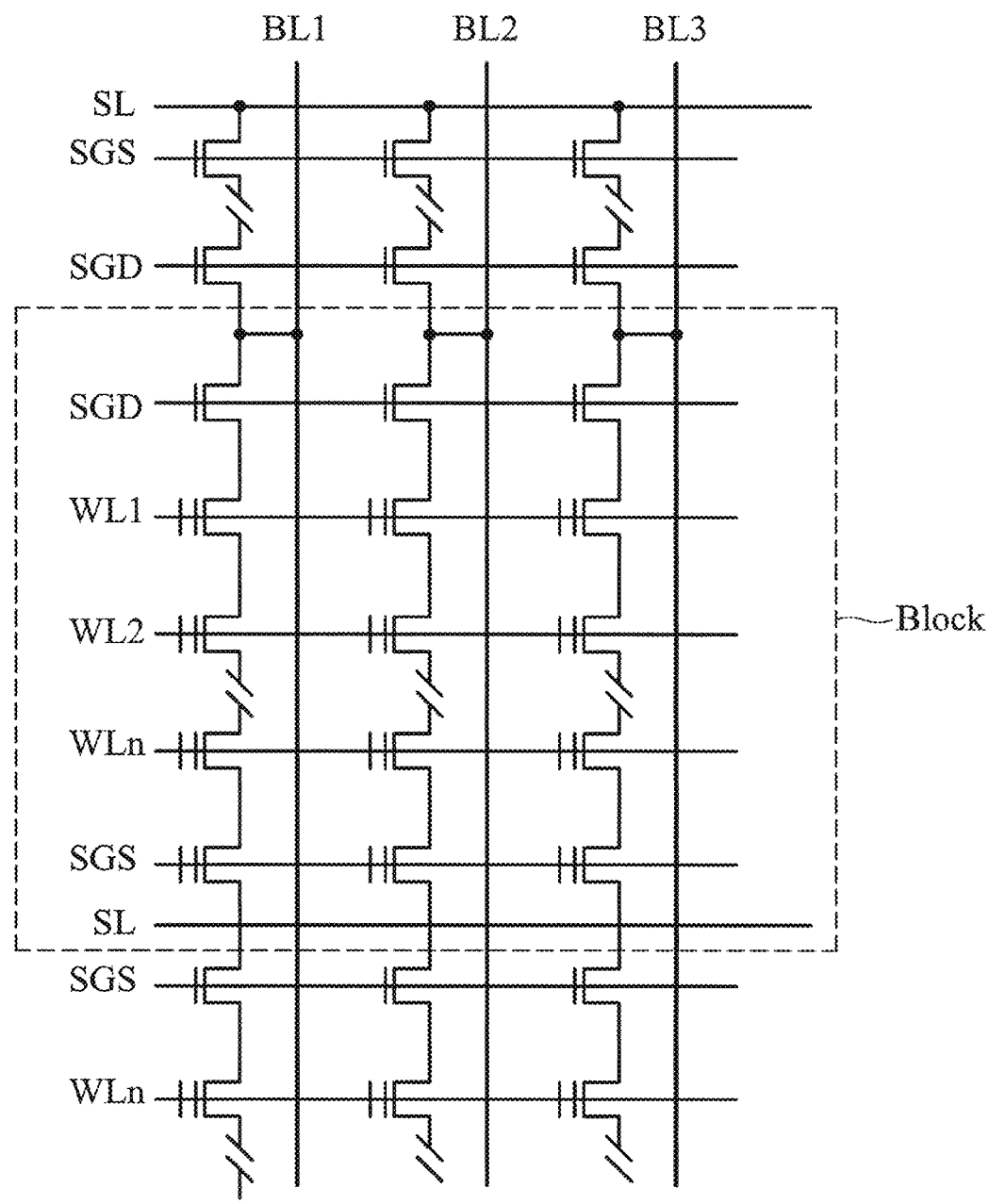
FIG. 2 shows an equivalent circuit of a NAND-type flash memory.
Figure 3:
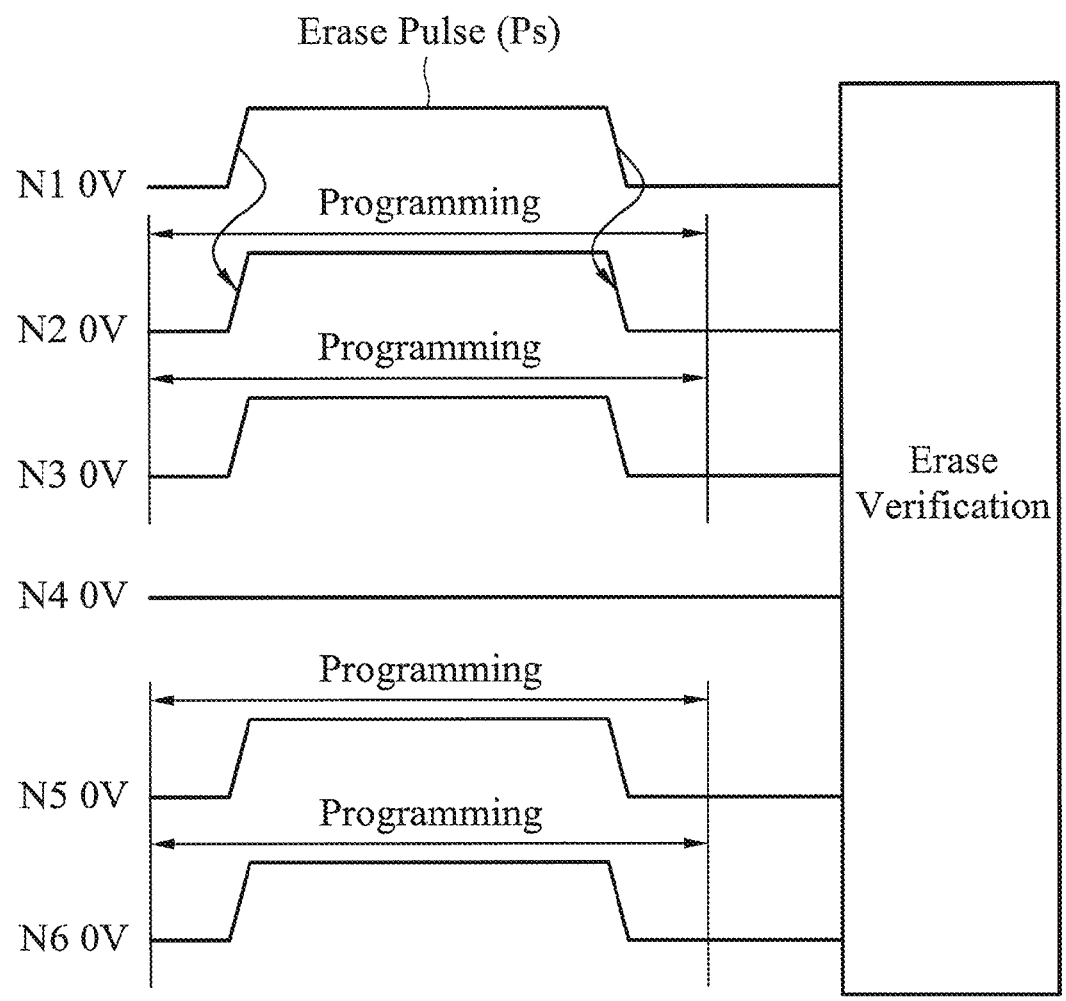
FIG. 3 shows voltage waveforms of nodes in a conventional NAND-type flash memory when the NAND flash memory carries out an erase operation.
Figure 4:
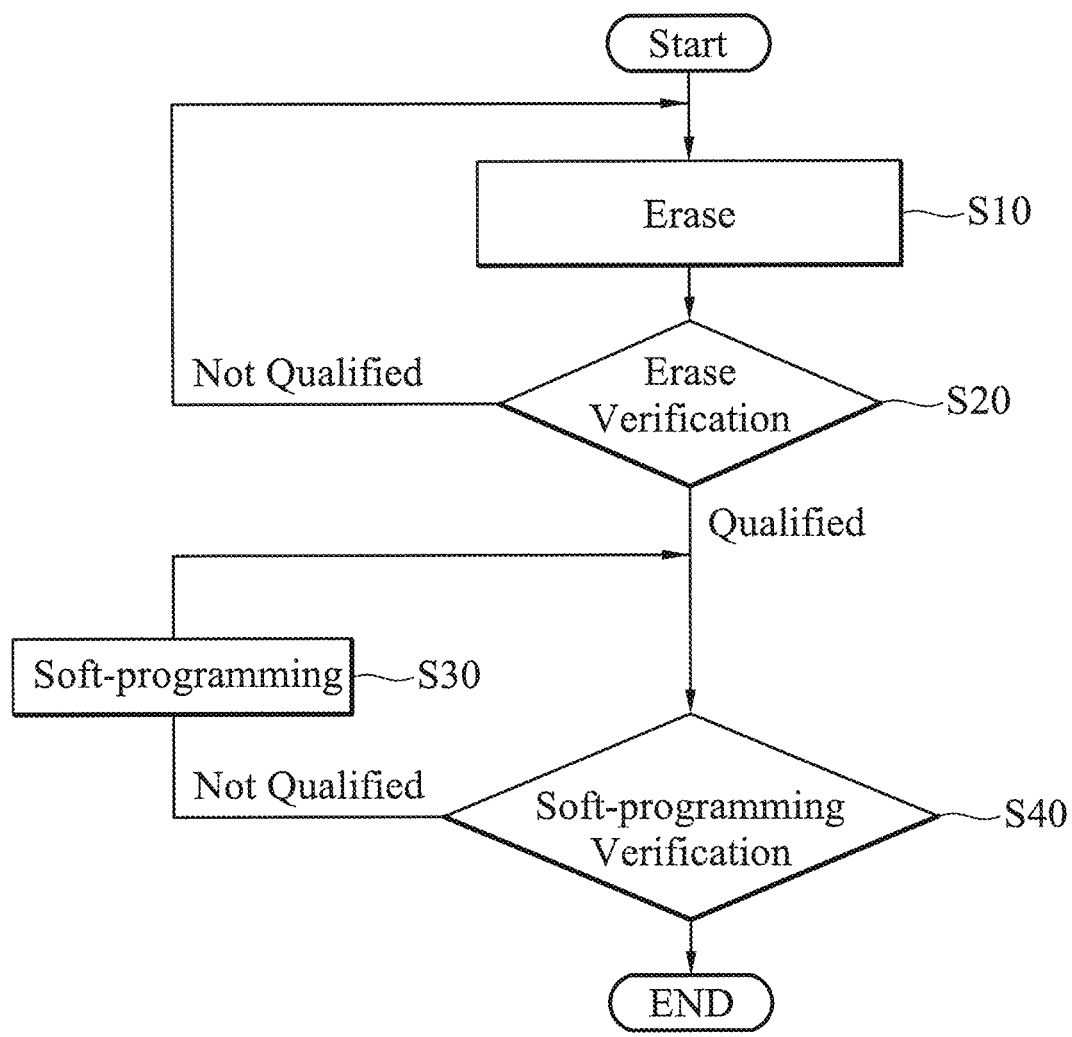
FIG. 4 shows a soft-program method for a conventional flash memory.

As shown in FIG. 2, the memory array 110 comprises NAND strings. Each of the NAND strings comprises a plurality of memory cells connected in series. The memory cell has a MOS structure, comprising $n^+$ diffusion regions formed in a P-well as a source and a drain, a tunnel oxide film formed on a channel region, a floating gate (charge accumulation layer) formed on the tunnel oxide film, and a control gate formed on the floating gate by virtue of a dielectric film. Typically, when the floating gate accumulates positive charges, i.e., data '1' is written in the memory cell, the threshold value is in a negative state and a voltage of 0V at the control gate turns on the memory cell. When the floating gate accumulates electrons, i.e., data '0' is written in the memory cell, the threshold value is shifted toward a positive value and thus the voltage of 0V at the control gate turns off the memory cell. However, the memory cell is not limited to storing only one single bit, and it may store multiple bits.

Figures 7, 8:
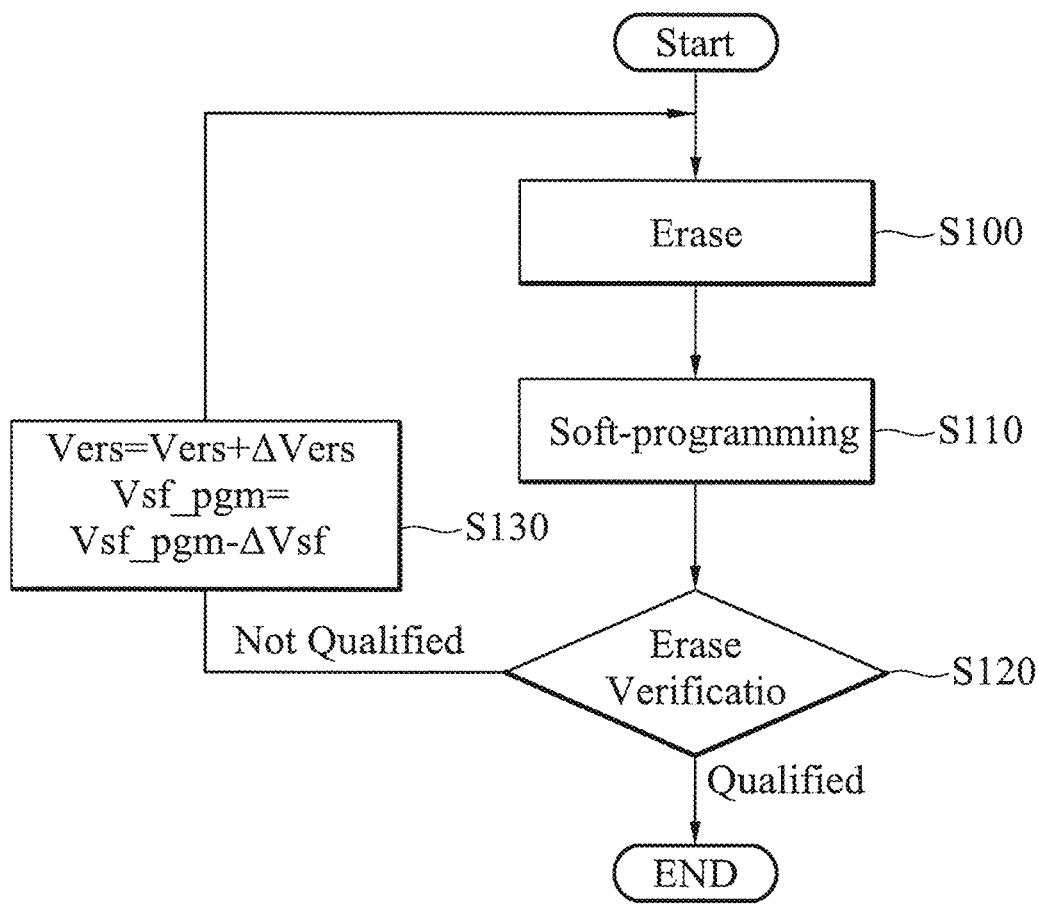
FIG. 7 is an example showing voltages applied to the flash memory when it operates.
FIG. 8 is a flow chart showing an erase operation of the flash memory according to an exemplary embodiment of the disclosure.

FIG. 7 is an exemplary table showing voltages applied to the flash memory when it operates. In a read operation, a certain positive voltage is applied to the bit line, a certain voltage (e.g., 0V) is applied to the selected word line, a pass voltage (e.g., 4.5V) is applied to the non-selected word line, a positive voltage (e.g., 4.5V) is applied to the selection gate lines SGD and SGS, the bit-line selection transistor and the source-line selection transistor are turned on, and 0V is applied to a common source line. In a programming (writing) operation, a programming voltage (15~20V) of high voltage is applied to the selected word line, an intermediate voltage (e.g., 10V) is applied to the non-selected word line, a power source voltage Vcc is applied to the selection gate-line SGD to turn on the bit-line selection transistor, and 0V is applied to the selection gate-line SGS to turn on the source-line selection transistor thereby supplying the voltage corresponding to data '1' or '0' to the bit line GBL.

In an erase operation, a voltage (e.g., 0V) is applied to the selected word line (i.e., the control gate) in the block, and an erase pulse of high voltage (e.g., 18V or above) is applied to the P-well to erase data in the block unit by virtue of pulling the electrons of gate out of the substrate. In the erase method of this embodiment, the soft-programming will be carried out after applying the erase pulse and it will be described in the following paragraph.

Next, the erase operation of the flash memory in a first embodiment is described. In a desirable implementation of this embodiment, ISPE (Incremental Step Pulse Erase) is adopted for effectively carrying out data erasing on the memory cell. The ISPE is a method for repeatedly applying erase pulses. The ISPE applies erase pulses to the memory cells in the selected block, and then determines if the threshold values of the erased memory cells are qualified. When the erased memory cells are not qualified, a pulse that is higher than the previous one is applied to the erased memory cells, and this process is repeated until all the memory cells in the selected block are qualified. As the number of data rewrites increases, it becomes difficult to erase data from the memory cells, but such a change in property can be dealt with by virtue of ISPE.

FIG. 8 shows a flow chart of an erase operation in this embodiment. First, the controller 150 receives an erase command and the address of the memory cells to be erased and starts an erase operation (S100). In particular, the word-line selection circuit 160 selects the block to be erased and applies 0V to the word lines of the selected block, and the erase pulse generated by the internal voltage generating circuit 190 is applied to the P-well. In this way, a high electrical field is introduced in the oxide film below the floating gate, a tunnel current will flow from the floating gate to the silicon substrate, and the threshold values of the memory cells in the block is deviated toward negative value.

Figure 10:
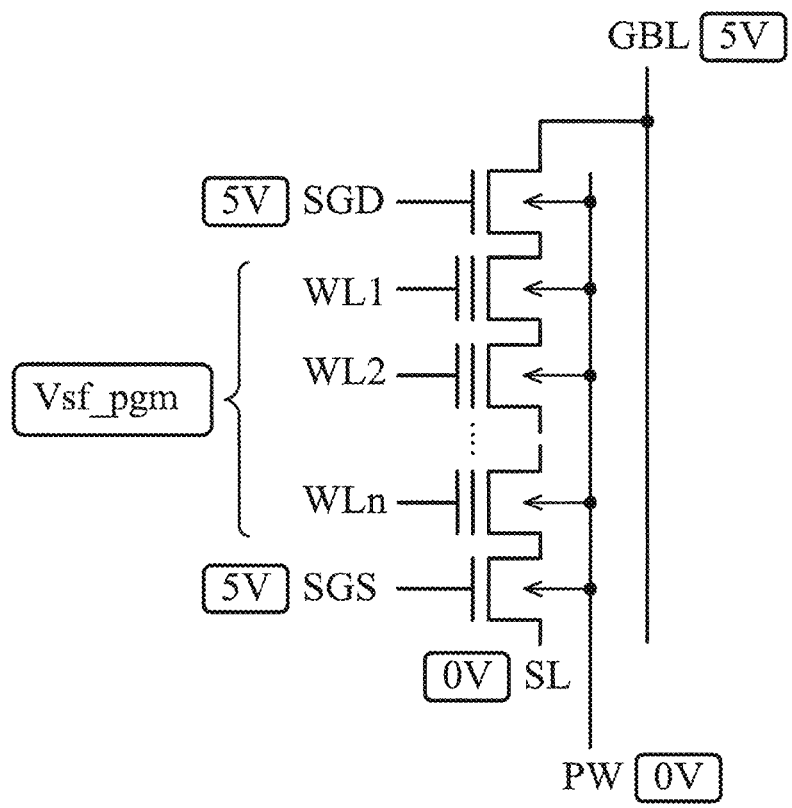
FIG. 10 shows bias conditions for carrying out soft-program in the first embodiment.

Subsequently, the controller 150 carried out soft-programming to all memory cells of the selected block (S110). FIG. 10 shows an example of bias condition for soft-programming. A soft-programming voltage Vsf_pgm which is much less than the general programming voltage Vpgm is applied to the word lines WL1~WLn of all memory cells of the selected block. The power source voltage Vcc (e.g., 5V) is applied to the selection gate-lines SGD and SGS, 5V is applied to the bit line GBL, and 0V is respectively applied to the source line SL and P-well (PW). In this way, electrons can be easily injected from the channel region to the floating gate, and the threshold value of the memory cell is deviated to positive value. In soft-programming operation, the charges are easily to be injected to the over-erased memory cells which have threshold values close to the lower limit of the threshold value distribution and are difficult to be injected to the memory cells which have threshold values close to the upper limit of the threshold value distribution. In this way, soft-programming is carried out all at once, to all memory cells in the selected block.

After performing soft-programming, erase verification is carried out to verify whether the threshold value of the memory cell is less than an erase verification voltage (S120). In the erase verification, the erase verification voltage is applied to all word lines of the selected block and a read-out operation is carried out by the same bias condition as that used in the general read-out operation. When the determination is not qualified in the erase verification, the erase operation is carried out again to the memory cells of the selected block. At this time, the erase voltage is set larger than the previous erase voltage and the soft-programming voltage is set smaller than the previous soft-programming voltage. That is, the erase voltage Vers is set at Vers+ΔVers and the soft-programming voltage Vsf_pgm is set at Vsf_pgm−ΔVsf (S130). Then, the erase operation and soft-programming operation are carried out on all of the memory cells of the selected block (S100, S110). When the threshold values of all memory cells of the selected block are verified to be less than the erase verification voltage, the erase operation is stopped. It should be noted that the application of the erase pulse and the application of the soft-programming pulse are carried out in a set. As a result, the number of erase pulses applied is equal to the number of soft-programming pulses applied.

Figure 5:
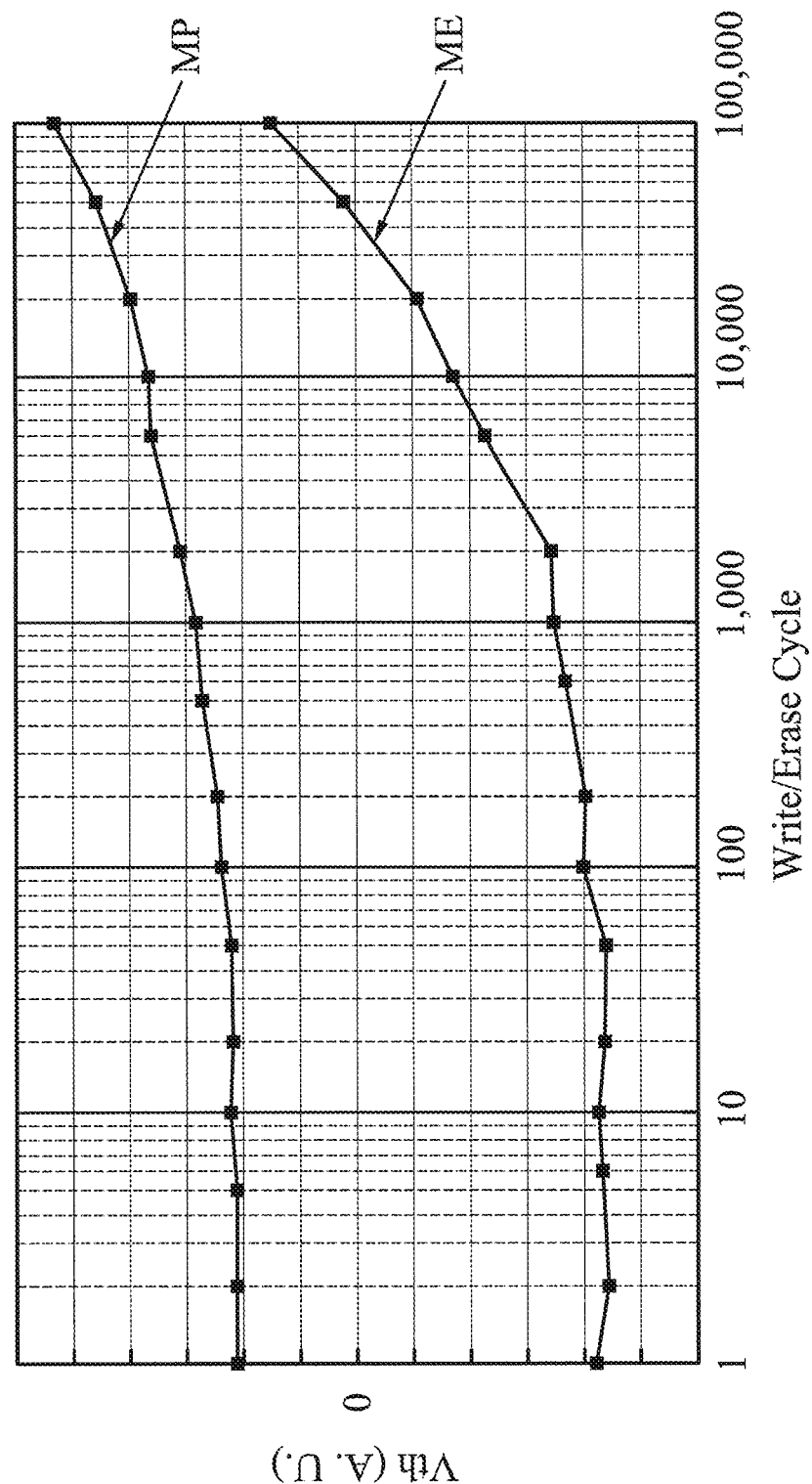
FIG. 5 is an experiment result showing the relationship between the number of data rewrites and the threshold values of memory cells.
Figure 9A:
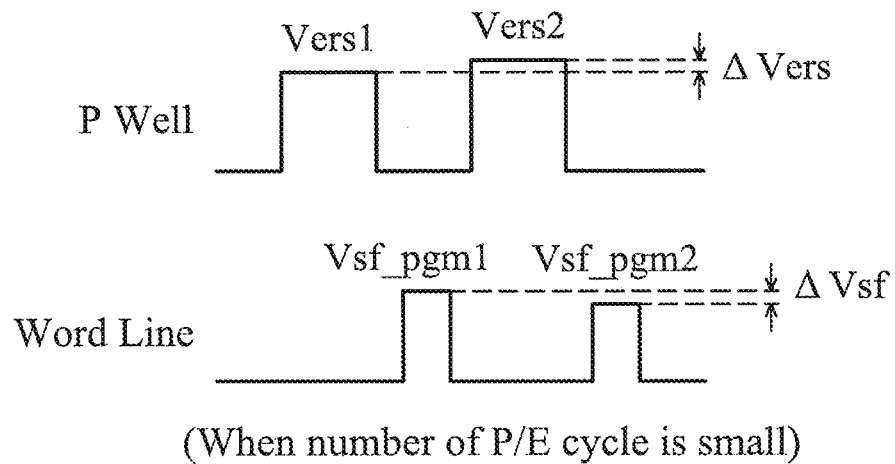
FIGS. 9A and 9B are timing charts respectively showing erase voltage and soft-program voltage in an erase operation according to a first embodiment of the disclosure.
Figure 9B:
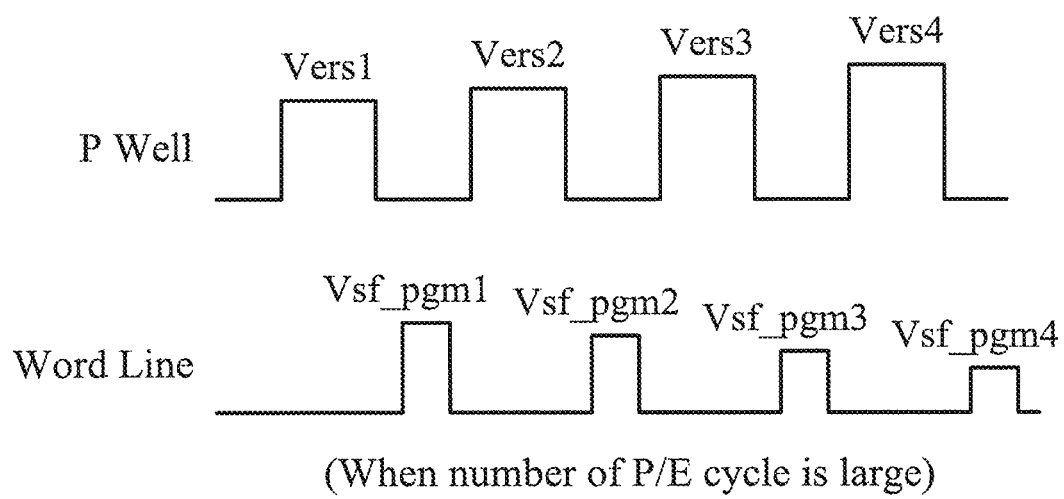

FIGS. 9A and 9B show timing charts of erase pulses and soft-programming pulses. FIG. 9A shows an example stage when the number of write/erase cycles is small. As shown in FIG. 5, when the number of write/erase cycles is small, the variation of the threshold value of the memory cell is small. Therefore, erasing the selected block is achieved by virtue of applying small number of erase pulses. In FIG. 9A, the erase pulse that is applied first has peak value of Vers1 and the erase pulse that is applied second has peak value of Vers2 which is larger than Vers1 by a mere ΔVers. That is, the erase pulses are increased step by step based on ISPE.

In FIG. 9A, the first soft-programming pulse is applied after the first erase pulse is applied. The first soft-programming pulse has a soft-programming voltage Vsf_pgm1. The second soft-programming pulse has a soft-programming voltage Vsf_pgm2 which is smaller than Vsf_pgm1 by a mere ΔVsf. That is, the voltages of the soft-programming pulses are decreased step by step based on DSPSP (Decremental Step Soft Program), in this embodiment.

FIG. 9B shows an example stage when the number of write/erase cycles is larger. When the number of write/erase cycles is larger, the variation of the threshold value of the memory cell becomes large. Because electron tunneling from the floating gate to the channel region becomes difficult, the number of erase pulses applied will increase. Here, four erase pulses are applied in this embodiment, for example. The four erase pulses Vers1~Vers4 follow the relationship of Vers1<Vers2<Vers3<Vers4, wherein the increment is equal to ΔVers. After applying each of the four erase pulses, four soft-programming pulses are respectively applied. The four soft-programming pulses Vsf_pgm1~Vsf_pgm4 follow the relationship of Vsf_pgm1>Vsf_pgm2>Vsf_pgm3>Vsf_pgm4, wherein the decrement is equal to ΔVsf.

According to the erase method described in the embodiment above, erase pulses are applied based on ISPE and soft-programming pulses are applied based on DSPSP. Such an erase method can compensate for the change in property of the memory cells resulting from an increasing number of write/erase cycles. That is, when the number of data rewrites increases, it becomes difficult to erase memory cells and therefore the erase voltages are increased step by step based on ISPE. On the other hand, programming memory cells becomes easy and therefore the soft-programming voltages are decreased step by step based on DSPSP. In this way, the threshold value distribution of the memory cells can be accurately controlled, thereby inhibiting the deterioration of reliability resulting from deterioration of isolation film.

In the embodiment described above, the increments (ΔVers) between every two erase pulses which are applied based on the ISPE are set at a fixed value, but this is merely an example and the increments (ΔVers) are not necessarily a fixed value. For example, the increments (ΔVers) can be decreased step by step, or, on the contrary, can be increased step by step. Moreover, waveforms of the erase pulse and soft-programming pulse are set rectangular in the embodiment described above, but this is merely an example. The waveforms of the erase pulse and soft-programming pulse need not be fixed waveforms, and can be waveforms that change. For example, the pulse waveform can be a waveform having a portion of a triangle shape.

In addition, a soft-programming operation is carried out after applying the erase pulses according to the erase method of this embodiment. After soft-programming operation, erase verification is set to be carried out to obtain the secondary effects as follows.

Figure 11:
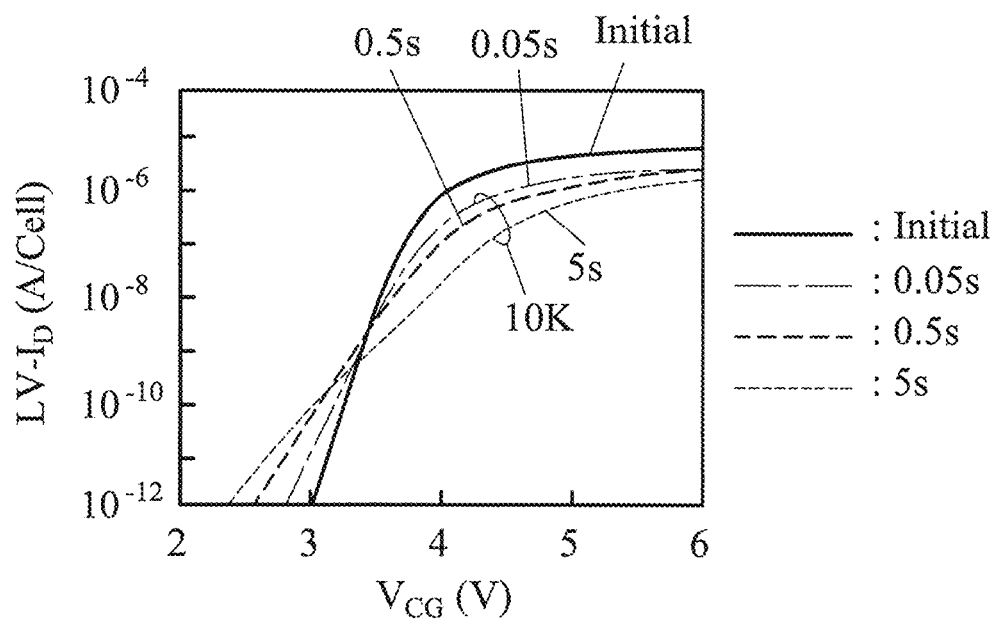
FIG. 11 shows I-V characteristics of memory cells and the dependency to the time interval from erasing to writing.

One of the factors which deteriorates the isolation film (such as a silicon oxide film) between the floating gate and channel region is that deterioration of oxide film is confirmed in the period from the time when the erase pulse is applied to the P-well to the time when the write pulse is applied. FIG. 11 shows an experimental result of detecting the I-V characteristics of a memory cell under a programming state, by changing the time interval from the time after the erase pulse is applied to the P-well to the time for applying the write pulse to the word line, and by repeatedly carrying out data rewriting. In FIG. 11, the curves depicted in the dot chain line, broken line, and dot line respectively show the I-V characteristics of memory cells with 10000 write/erase cycles when the time intervals from erasing to writing are respectively predetermined at 0.05, 0.5 and 5 seconds. The three curves are compared to an initial curve showing I-V characteristics of memory cells without being programmed. From the detection result, the characteristics curve having a smaller time interval is much closer to the initial characteristics curve. That is, when the time interval is large, the trap potential in the silicon interface of the memory cell increases, the deviation from the initial I-V characteristics becomes large, the conductance Gm of the memory cell deteriorates further, and thus the dependency between the control gate potential and I-V characteristics is reduced. So we can see that degree of deterioration of the oxide film varies in a way that corresponds to the placing time after an erase pulse is applied to the memory cell.

When the erase pulse is applied to the P-well, a high voltage appears at the tunnel oxide below the floating gate, whereby the electrons flow from the floating gate to the silicon substrate side by virtue of Fowler-Nordheim tunneling effect. The electrons arriving at the substrate become high-energy electrons, which results in the generation of high-energy holes. A part of the holes are injected into the oxide film. As a result, an interface potential is generated because the holes are captured in the oxide film, thereby resulting in deterioration of the oxide film.

After applying the erase pulse, soft-programming is carried out rather than erase verification, and the electrons are injected from the channel region into the floating gate through the oxide film. At this time, because a part of the electrons combine the captured holes in the oxide film, a part of or most of the holes in the oxide film can be eliminated. The longer the placing time after the erase pulse is applied to the memory cell, the worse the deterioration of the oxide film. Therefore, performing the soft-programming rather than the erase verification after the erase pulse is applied will make it easier to control the deterioration of the oxide film.

Figure 12A:
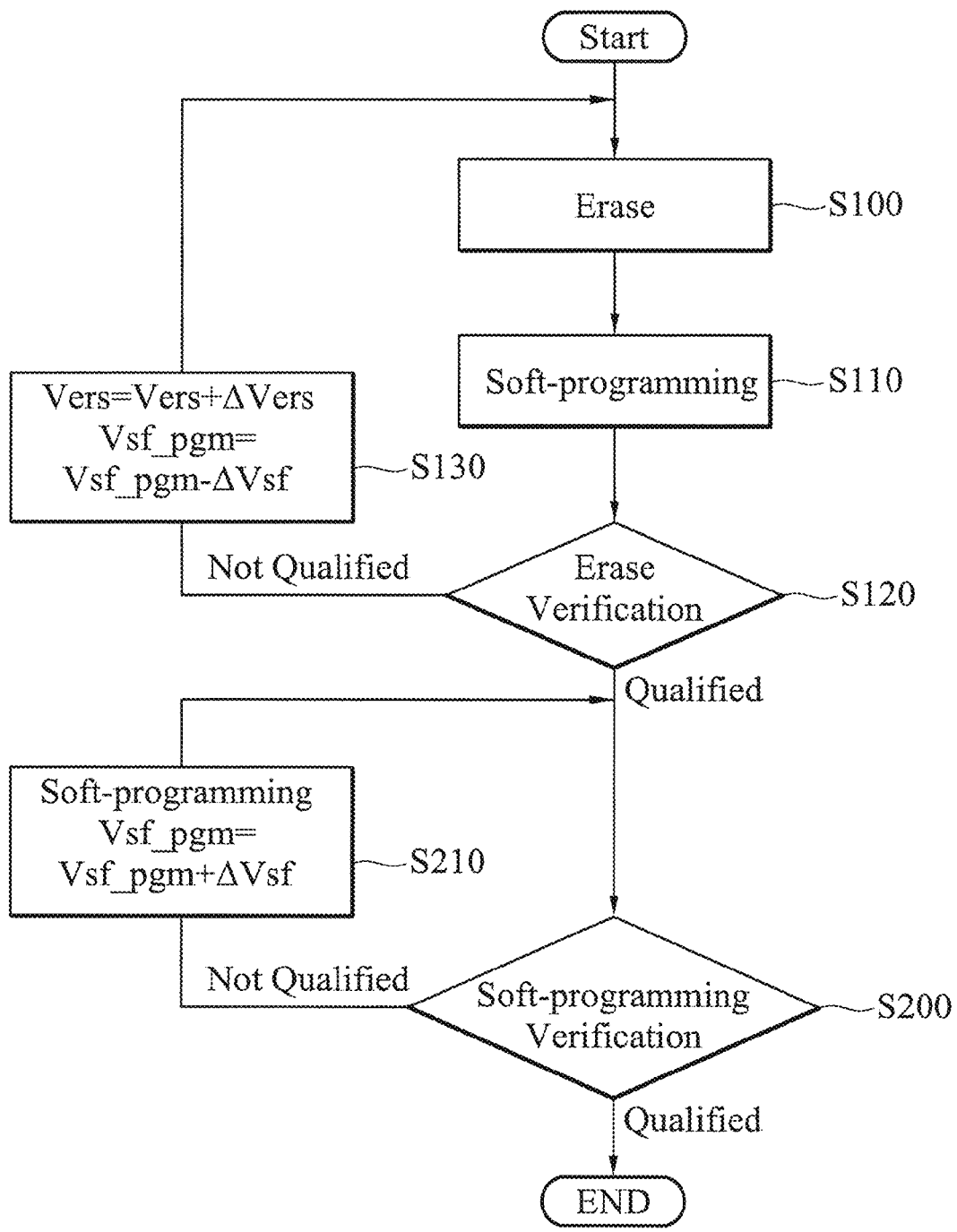
FIGS. 12A and 12B show a flow chart of an erase operation according to a second embodiment of the disclosure.

Next, a second embodiment according to the invention is described as follows. FIG. 12A shows a flow chart of an erase operation according to the second embodiment. In FIG. 12A, steps S100~S130 are the same as those described in the first embodiment. In the second embodiment, a soft-programming verification is carried out (S200) when the erase verification is qualified. A Soft-programming verification voltage (SF verification voltage) is applied to all word lines in the selected block to determine whether the memory cells in the selected block are qualified or not by virtue of a sensor circuit. In particular, the soft-programming verification are not qualified if the threshold values of the memory cells are smaller than the SF verification voltage, and otherwise they are qualified if the threshold values of the memory cells are larger than the SF verification voltage.

When the soft-programming verification is not qualified, a soft-programming is carried out in step S210. The soft-programming in steps S210 and S110 are performed independently. As the difference from the soft-program of S110, when the soft-programming pulses are applied repeatedly, the soft-programming voltages applied in the soft-programming of S210 are increased step by step. The initial soft-programming voltage in step S210 is the final soft-programming voltage set in step S110. A programming inhibition voltage (such as a positive voltage) is applied to the bit lines of the memory cells which are not qualified in the soft-programming verification. A programmable voltage (such as 0V) is applied to the bit lines of the memory cells which are qualified in the soft-programming verification. The threshold values of the memory cells which are not qualified in the soft-programming verification further deviates toward the positive value. The steps S200 and S210 are repeated until all the bit lines (memory cells) are qualified.

Figure 12B:
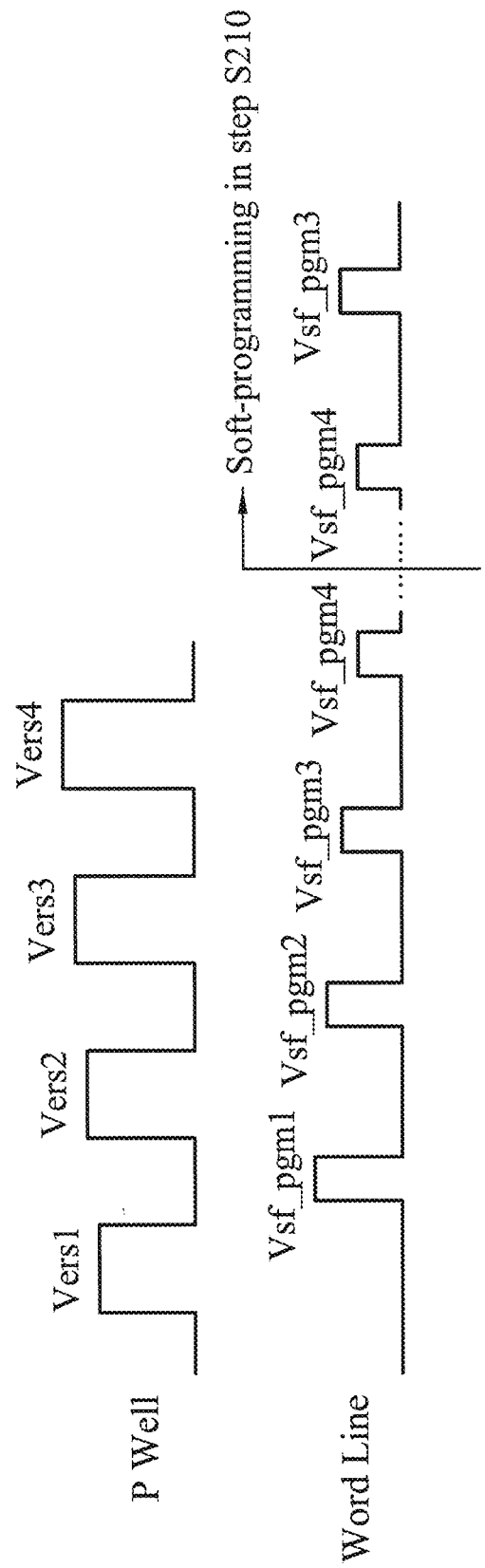

FIG. 12B is an example showing that two soft-programming pulses are applied in step S210 after the time when the erase pulses have been applied four times, and the erase verification is determined to be qualified. When the erase verification (S120) is qualified but the soft-programming verification (S200) is not qualified, the soft-programming voltage Vsf_pgm4 of the fourth soft-programming pulse applied in step S110 serves as the initial voltage of the soft-programming in step S210. That is, the soft-programming voltage Vsf_pgm4 is initially applied in step S210. In the soft-programming verification, if the verification is not qualified again, a soft-programming voltage Vsf_pgm3, which is larger than the previous one (Vsf_pgm4) by a mere ΔVsf (where Vsf_pgm3>Vsf_pgm4), is applied in step S210.

Consideration for that the memory cell becomes programmed easily due to the increasing number of data rewrites, the soft-programming pulses are applied based on DSPSP. However, the characteristics of the memory cells vary, and the distribution of the threshold values of all the memory cells may not necessarily fall below a certain value. Therefore, a soft-programming verification is carried out after the erase verification to more accurately control the lower limit of the threshold value distribution of the memory cells. Moreover, the soft-programming voltage is set to be increased step by step in the soft-programming after the soft-programming verification. For memory cells which are easily programmed, their threshold values are sufficiently shifted toward a positive value by performing the soft-programming in step S110. The memory cells which are not qualified in the soft-program verification will not be deviated in the direction of the positive value, i.e., they are presumed to be memory cells that are difficult to program. Therefore, the soft-programming voltages are applied in step by step increments.

In the first embodiment, the number of erase pulses applied is generally equal to the number of soft-programming pulses applied, but in the second embodiment, the number of soft-programming pulses applied may become greater than the number of erase pulses applied. In the second embodiment, the threshold value distribution of the memory cells are accurately controlled by virtue of performing the soft-programming verification to compensate for the lower reliability that results from an increasing number of data rewrites.

The embodiments described above are examples of a NAND-type flash memory. However, the erase method according to the invention can be applied to NOR-type flash memory having a control gate and a floating gate. Furthermore, the above embodiments are illustrated in the flash memory having memory cells formed in two-dimensions on the surface of the silicon substrate. But the invention can also be applied to a flash memory having memory cells formed in three-dimensions on the surface of the silicon substrate.

While the invention has been described by virtue of examples and in terms of the embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An erase method of a non-volatile semiconductor memory device, the non-volatile semiconductor memory device having a memory array of memory cells, each of the memory cells having a control gate, a charge accumulation layer and a channel region, the erase method comprising:
    a selection step, selecting at least a memory cell to be erased from the memory array;
    an erase step, erasing charges in the accumulation layer by virtue of applying an erase voltage to the channel region of the selected memory cell; and
    a soft-programming step, after applying the erase voltage, applying a soft-programming voltage, which is smaller than a programming voltage for programming the memory cell, to the control gate of the selected memory cell, thereby carrying out soft-programming to the charges in the charge accumulation layer;
    wherein in the erase step, the erase voltage is increased step by step when the erase voltage is repeatedly applied, and in the soft-programming step, the soft-programming voltage is decreased step by step when the soft-programming voltage is applied repeatedly;
    wherein the erase method further comprises an erase verification step, determining if erasure of the memory cell is qualified;
    wherein the erase verification is carried out after the soft-programming step; and
    wherein when the erase verification step determines the erasure of the memory cell is not qualified, the erase voltage is set larger than a previous erase voltage and the soft-programming voltage is set smaller than a previous soft-programming voltage and then the erase step and the soft-programming step are carried out.

2. The erase method as claimed in claim 1, wherein the soft-programming is carried out right after the erase step and no erase verification is carried out between the erase step and the soft-programming step.

3. The erase method as claimed in claim 1, wherein a number of times that the erase voltage is applied is equal to a number of times that the soft-programming voltage is applied.

4. The erase method as claimed in claim 1, further comprising a soft-programming verification step, carried out after the erase verification step to determine whether the soft-programming of the memory cell is qualified; and
    wherein when the soft-programming verification step determines the soft-programming of the memory cell is not qualified, the soft-programming step is carried out on the memory cell which is not qualified.

5. A non-volatile semiconductor memory device comprising:
    a memory array having a plurality of memory cells, each of the memory cells having a control gate, a charge accumulation layer and a channel region;
    a selection device, selecting at least a memory cell to be erased from the memory array; and
    an erase device, erasing data in the selected memory cell selected by virtue of the selection device;
    wherein the erase device:
        erases charges in the accumulation layer by virtue of applying an erase voltage to the channel region of the selected memory cell;
        after applying the erase voltage, applies a soft-programming voltage, which is smaller than a programming voltage for programming the memory cell, to the control gate of the selected memory cell, thereby carrying out soft-programming to the charges in the charge accumulation layer; and
        increases the erase voltage step by step when the erase voltage is repeatedly applied and decreases the soft-programming voltage step by step when the soft-programming voltage is applied repeatedly;
    wherein the erase device further carries out an erase verification to determine whether the data erasing of the memory cell is qualified after carrying out the soft-programming; and
    wherein when the determination is not qualified by the erase verification, the erase device sets the erase voltage larger than a previous erase voltage and sets the soft-programming voltage smaller than a previous soft-programming voltage and then carries out the data erasing and soft-programming of the memory cell.

6. The non-volatile semiconductor memory device as claimed in claim 5, wherein after carrying out data erasing of the memory cell, the erase device carries out a soft-programming rather than an erase verification.

7. The non-volatile semiconductor memory device as claimed in claim 5, wherein the erase device further carries out a soft-programming verification to determine whether soft-programming of the memory cell is qualified after the erase verification; and
    wherein when the determination is not qualified by the soft-program verification, the erase device carries out the soft-programming to the memory cell which is not qualified.

8. The non-volatile semiconductor memory device as claimed in claim 5, wherein the memory array comprises NAND-type strings; the selection device selects a block to be erased and the erase device erases memory cells of the selected block.

* * * * *